(12) United States Patent
Tain et al.

(10) Patent No.: US 10,881,006 B2
(45) Date of Patent: Dec. 29, 2020

(54) PACKAGE CARRIER AND PACKAGE STRUCTURE

(71) Applicant: Unimicron Technology Corp., Taoyuan (TW)

(72) Inventors: Ra-Min Tain, Hsinchu County (TW); Pei-Chang Huang, Taoyuan (TW); Chi-Chun Po, New Taipei (TW); Chun-Lin Liao, Taoyuan (TW); Po-Hsiang Wang, New Taipei (TW); Hsuan-Wei Chen, New Taipei (TW)

(73) Assignee: Unimicron Technology Corp., Taoyuan (TW)

(*) Notice: Subject to any disclaimer, the term of this patent is extended or adjusted under 35 U.S.C. 154(b) by 0 days.

(21) Appl. No.: 16/739,133

(22) Filed: Jan. 10, 2020

(65) Prior Publication Data

US 2020/0329565 A1    Oct. 15, 2020

Related U.S. Application Data

(60) Provisional application No. 62/831,738, filed on Apr. 10, 2019.

(30) Foreign Application Priority Data

Nov. 15, 2019 (TW) ............................. 108141610 A

(51) Int. Cl.
*H05K 1/11* (2006.01)
*H05K 3/10* (2006.01)

(52) U.S. Cl.
CPC ............. *H05K 3/103* (2013.01); *H05K 1/111* (2013.01); *H05K 2201/0338* (2013.01)

(58) Field of Classification Search
CPC ........... H05K 1/111; H05K 1/11; H05K 1/112
See application file for complete search history.

(56) References Cited

U.S. PATENT DOCUMENTS

| | | | |
|---|---|---|---|
| 8,796,561 B1* | 8/2014 | Scanlan | H05K 1/185 174/260 |
| 9,089,072 B2 | 7/2015 | Lee et al. | |
| 9,177,897 B1 | 11/2015 | Do et al. | |
| 2006/0033209 A1 | 2/2006 | Iimura et al. | |
| 2016/0177024 A1* | 6/2016 | Nishiyama | C08L 63/04 257/100 |
| 2017/0048973 A1* | 2/2017 | Cheng | H05K 1/0298 |

FOREIGN PATENT DOCUMENTS

CN            103140036        6/2013

OTHER PUBLICATIONS

"Office Action of Taiwan Counterpart Application", dated Oct. 28, 2020, p. 1-p. 5.

* cited by examiner

*Primary Examiner* — Jeremy C Norris
(74) *Attorney, Agent, or Firm* — JCIPRNET

(57) ABSTRACT

A package carrier includes a plurality of first circuit patterns, a plurality of second circuit patterns and an insulating material layer. The second circuit patterns are disposed between any two the first circuit patterns and are directly connected to the first circuit patterns. In a cross-sectional view, a first thickness of each of the first circuit patterns is greater than a second thickness of each of the second circuit patterns. A first surface of each of the first circuit patterns is aligned with a second surface of each of the second circuit patterns. The insulating material layer at least contacts the first circuit patterns.

14 Claims, 5 Drawing Sheets

PACKAGE CARRIER AND PACKAGE STRUCTURE

CROSS-REFERENCE TO RELATED APPLICATION

This application claims the priority benefits of U.S. provisional application Ser. No. 62/831,738, filed on Apr. 10, 2019, and Taiwan application serial no. 108141610, filed on Nov. 15, 2019. The entirety of each of the above-mentioned patent applications is hereby incorporated by reference herein and made a part of this specification.

BACKGROUND

Field of the Invention

The invention relates to a package carrier and a package structure and more particularly, to a package carrier including circuit patterns with two thicknesses and a package structure using the package carrier.

Description of Related Art

At present, a thickness of a circuit layer on a circuit carrier ranges from 180 µm to 70 µm. If the thickness of the circuit layer is greater than 70 µm, the difficulty in manufacturing either by means of electroplating or etching is increased. Moreover, a line spacing between circuits must be controlled to be much smaller than the thickness of the circuit layer, which will be much challenging. In addition, a circuit configuration that can satisfy or meet different circuit requirements (e.g., for signal traces or power/ground layers) on the same plane will be a key point of the development of current circuit carriers.

SUMMARY

The invention provides a package carrier including circuit patterns with two different thicknesses that may satisfy different circuit requirements.

The invention further provides a package structure using the aforementioned package carrier that may have preferable applicability and use flexibility.

A package carrier of the invention includes a plurality of first circuit patterns, a plurality of second circuit patterns and an insulating material layer. The second circuit patterns are disposed between any two the first circuit patterns and are directly connected to the first circuit patterns. In a cross-sectional view, a first thickness of each of the first circuit patterns is greater than a second thickness of each of the second circuit patterns. A first surface of each of the first circuit patterns is aligned with a second surface of each of the second circuit patterns. The insulating material layer at least contacts the first circuit patterns.

In an embodiment of the invention, the insulating material layer is filled in gaps between the first circuit patterns and directly contacts a side surface of each of the first circuit patterns and a bottom surface of each of the second circuit patterns.

In an embodiment of the invention, the insulating material layer directly contacts a bottom surface of each of the first circuit patterns without contacting the second circuit patterns.

In an embodiment of the invention, the package carrier further includes a substrate. The insulating material layer is located between the first circuit patterns and the substrate.

In an embodiment of the invention, the substrate includes an insulating substrate or a conductive substrate.

In an embodiment of the invention, a material of the substrate includes a metal, an alloy or a ceramic material.

In an embodiment of the invention, a thermal conductivity coefficient of the insulating material layer is greater than or equal to 10 W/m.K.

In an embodiment of the invention, in a cross-sectional view, a first linewidth of each of the first circuit patterns is greater than a second linewidth of each of the second circuit patterns.

In an embodiment of the invention, the first thickness ranges between 70 µm and 500 µm.

A package structure of the invention includes a package carrier, at least one electronic component and an encapsulant. The package carrier includes a plurality of first circuit patterns, a plurality of second circuit patterns and an insulating material layer. The second circuit patterns are disposed between any two the first circuit patterns and are directly connected to the first circuit patterns. In a cross-sectional view, a first thickness of each of the first circuit patterns is greater than a second thickness of each of the second circuit patterns. A first surface of each of the first circuit patterns is aligned with a second surface of each of the second circuit patterns. The insulating material layer at least contacts the first circuit patterns. The at least one electronic component is disposed on at least one of the first circuit patterns. The encapsulant covers the electronic component and the package carrier.

In an embodiment of the invention, the insulating material layer is filled in gaps between the first circuit patterns and directly contacts a side surface of each of the first circuit patterns and a bottom surface of each of the second circuit patterns.

In an embodiment of the invention, the insulating material layer directly contacts a bottom surface of each of the first circuit patterns without contacting the second circuit patterns.

In an embodiment of the invention, the package carrier further includes a substrate. The insulating material layer is located between the first circuit patterns and the substrate.

In an embodiment of the invention, the substrate includes an insulating substrate or a conductive substrate.

In an embodiment of the invention, a material of the substrate includes a metal, an alloy or a ceramic material.

In an embodiment of the invention, a thermal conductivity coefficient of the insulating material layer is greater than or equal to 10 W/m.K.

In an embodiment of the invention, in a cross-sectional view, a first linewidth of each of the first circuit patterns is greater than a second linewidth of each of the second circuit patterns.

In an embodiment of the invention, the first thickness ranges between 70 µm and 500 µm.

In an embodiment of the invention, the package structure further includes an adhesive layer disposed between the electronic component and at least one of the first circuit patterns.

In an embodiment of the invention, the package carrier further includes at least one bonding wire. The electronic component is electrically connected to at least one of the first circuit patterns through the bonding wire.

Based on the above, in the design of the package carrier of the invention, the second circuit patterns are directly connected to the first circuit patterns. In a cross-sectional view, the first thickness of each of the first circuit patterns is greater than than the second thickness of each of the second circuit patterns, and the first surface of each of the first circuit patterns is aligned with the second surface of each of the second circuit patterns. In this way, the package carrier of the invention can simultaneously include the circuit patterns having two different thicknesses on the same plane to satisfy different circuit requirements. Moreover, the package structure using the package carrier of the invention can have preferable applicability and use flexibility.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
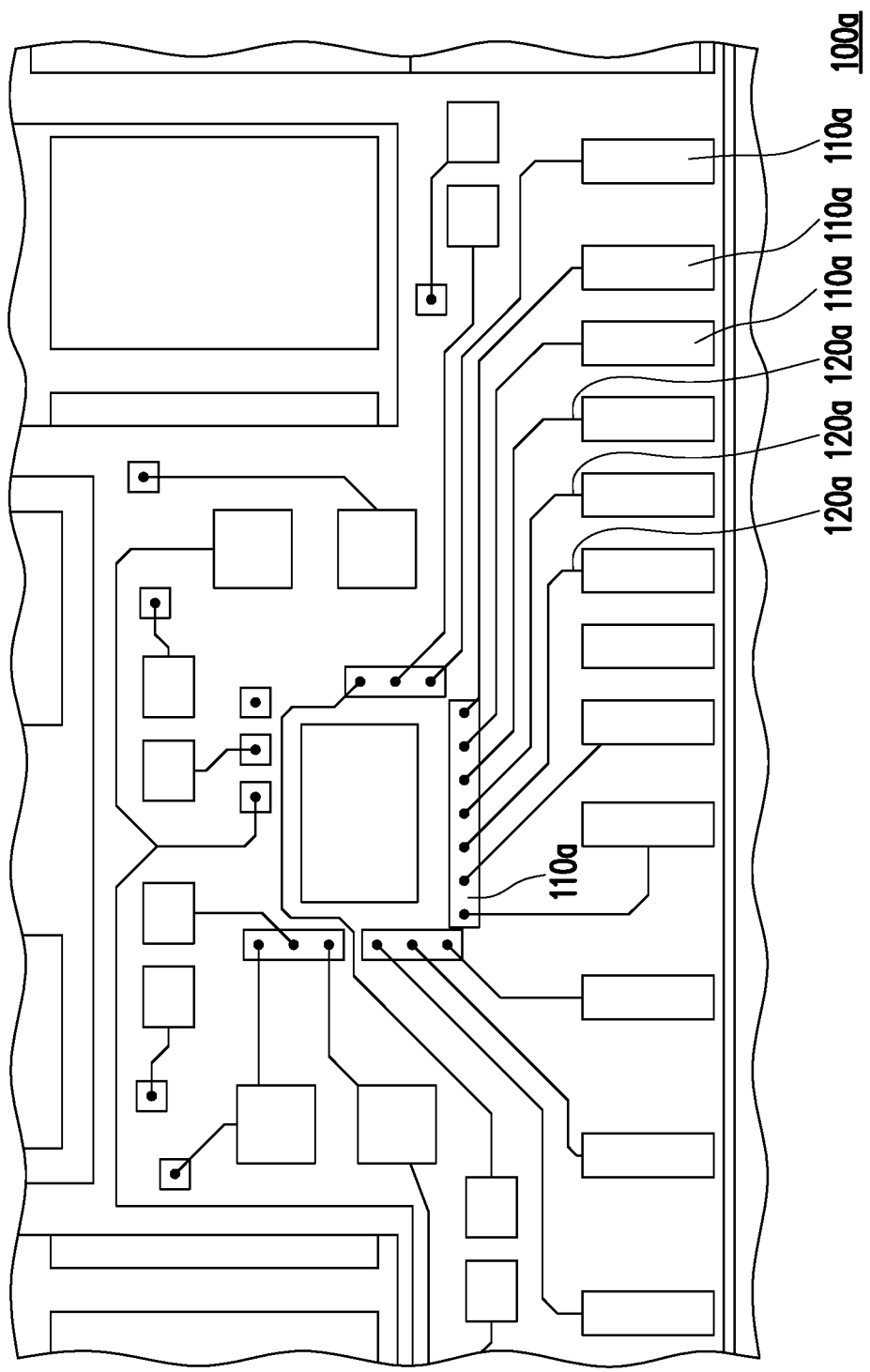
FIG. 1A is a schematic top view of a package carrier according to an embodiment of the invention.
Figure 1B:
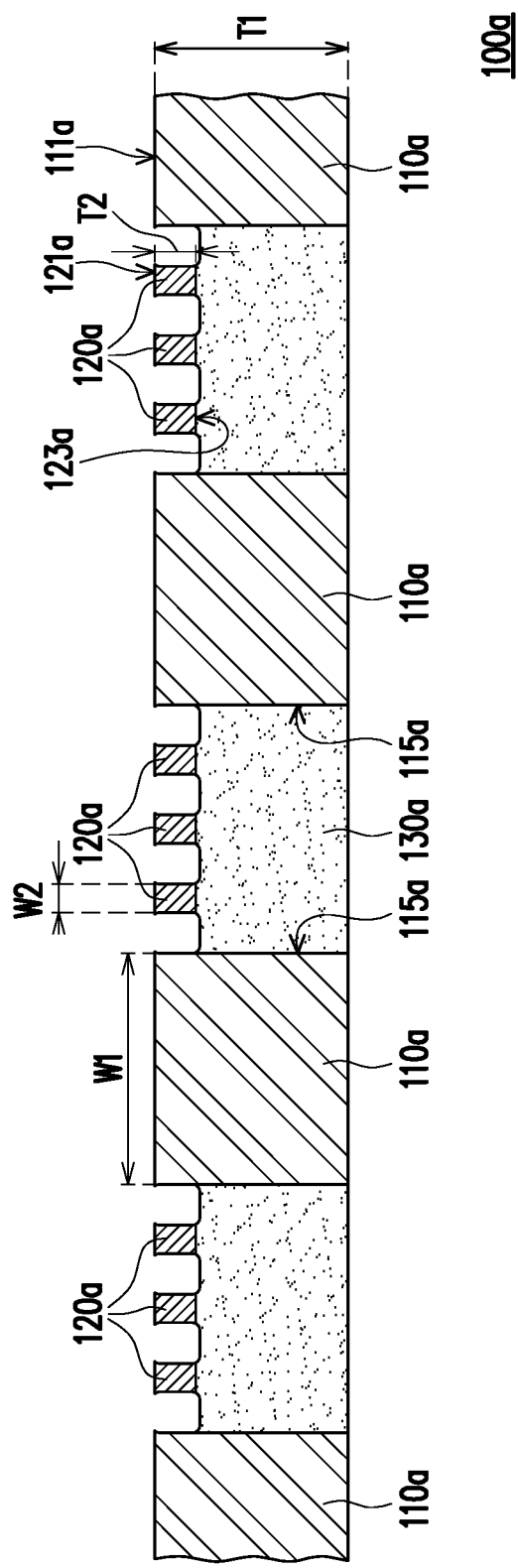
FIG. 1B is a schematic partial cross-sectional view of the package carrier depicted in FIG. 1.

FIG. 1A is a schematic top view of a package carrier according to an embodiment of the invention. FIG. 1B is a schematic partial cross-sectional view of the package carrier depicted in FIG. 1. Referring to FIG. 1A and FIG. 1B simultaneously, in the present embodiment, a package carrier 100a includes a plurality of first circuit patterns 110a, a plurality of second circuit patterns 120a and an insulating material layer 130a. The second circuit patterns 120a are disposed between any two the first circuit patterns 110a and are directly structurally and electrically connected connected to the first circuit patterns 110a. In a cross-sectional view, a first thickness T1 of each of the first circuit patterns 110a is greater than a second thickness T2 of each of the second circuit patterns 120a. A first surface 111a of each of the first circuit patterns 110a is aligned with a second surface 121a of each of the second circuit patterns 120a. The insulating material layer 130a at least contacts the first circuit patterns 110a.

Furthermore, the first thickness T1 of each of the first circuit patterns 110a of the present embodiment is, for example, 100 μm or more and preferably, ranges between 70 μm and 500 μm. A spacing between any two adjacent first circuit patterns 110a may be smaller than ½ of the first thickness T1. In a cross-sectional view, a first linewidth W1 of each of the first circuit patterns 110a is greater than a second linewidth W2 of each of the second circuit patterns 120a. In this case, the first linewidth W1 is, for example, at least 0.3 mm, and the second linewidth W2 is, for example, 0.05 mm to 0.3 mm. In this case, the first circuit patterns 110a are, for example, power/ground pads, and the second circuit patterns 120a are, for example, signal traces.

Moreover, the insulating material layer 130a of the present embodiment is filled in gaps between the first circuit patterns 11a and directly contacts a side surface 115a of each of the first circuit patterns 110a and a bottom surface 123a of each of the second circuit patterns 120a. In this case, a thermal conductivity coefficient of the insulating material layer 130a is greater than or equal to 10 W/m.K.

In brief, in the design of the package carrier 110a of the present embodiment, the second circuit patterns 120a are directly connected to the first circuit patterns 110a. In a cross-sectional view, the first thickness T1 of each of the first circuit patterns 110a is greater than than the second thickness T2 of each of the second circuit patterns 120a, and the first surface 111a of each of the first circuit patterns 110a is aligned with the second surface 121a of each of the second circuit patterns 120a. In this way, the package carrier 110a of the present embodiment may simultaneously include the circuit patterns having two different thicknesses on the same plane to satisfy different circuit requirements.

It should be noted that the reference numerals and a part of the contents in the previous embodiment are used in the following embodiments, in which identical reference numerals indicate identical or similar components, and repeated description of the same technical contents is omitted. The description related to the omitted parts can be found in the previous embodiment, and no repeated description is contained in the following embodiments.

Figure 2:
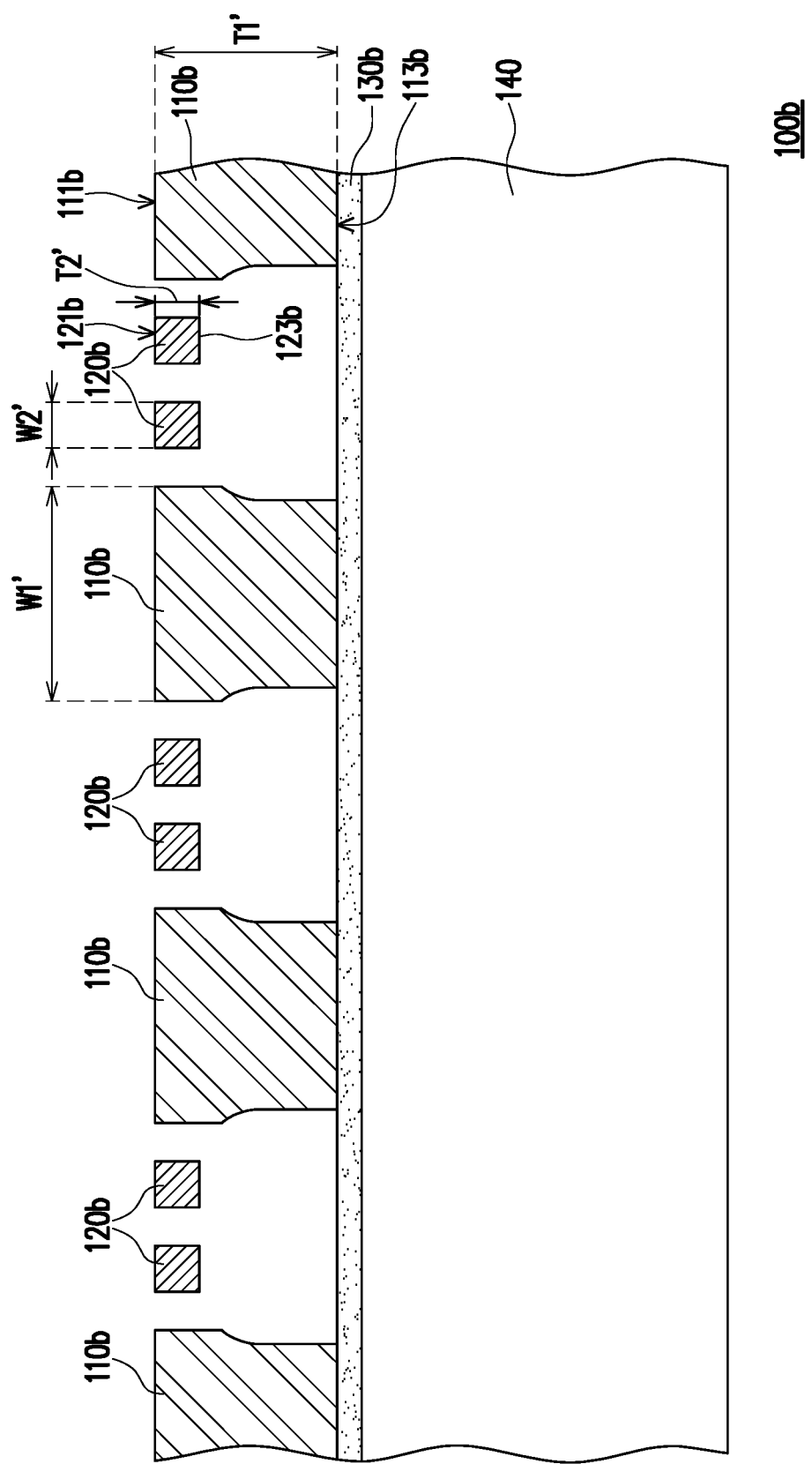
FIG. 2 is a schematic cross-sectional view of a package carrier according to another embodiment of the invention.

FIG. 2 is a schematic cross-sectional view of a package carrier according to another embodiment of the invention. Referring to FIG. 1B and FIG. 2 simultaneously, a package carrier 100b of the present embodiment is similar to the package carrier 100a illustrated in FIG. 1B, and the difference between the two embodiments lies in that an insulating material layer 130b directly contacts a bottom surface 113b of each first circuit pattern 113b without contacting each second circuit pattern 120b. In this case, a thermal conductivity coefficient of the insulating material layer 130b is greater than or equal to 10 W/m.K.

Moreover, the package carrier 100b of the present embodiment further includes a substrate 140, and the insulating material layer 130b is located between the first circuit patterns 110b and the substrate 140. The substrate 140 may be, for example, an insulating substrate made of, for example, a ceramic material. Alternatively, the substrate 140 may be, for example, a conductive substrate made of a metal (e.g., aluminum) or an alloy.

In the present embodiment, in a cross-sectional view, a first thickness T1' of each of the first circuit patterns 110b is greater than a second thickness T2' of each of the second circuit patterns 120b. A first surface 111b of each of the first circuit patterns 110b is aligned with a second surface 121b of each of the second circuit patterns 120b. On the other hand, a first linewidth W1' of each of the first circuit patterns 110b is greater than a second linewidth W2' of each of the second circuit patterns 120b. In this way, the package carrier 110b of the present embodiment may simultaneously include the circuit patterns having two different thicknesses on the same plane to satisfy different circuit requirements.

Figure 3A:
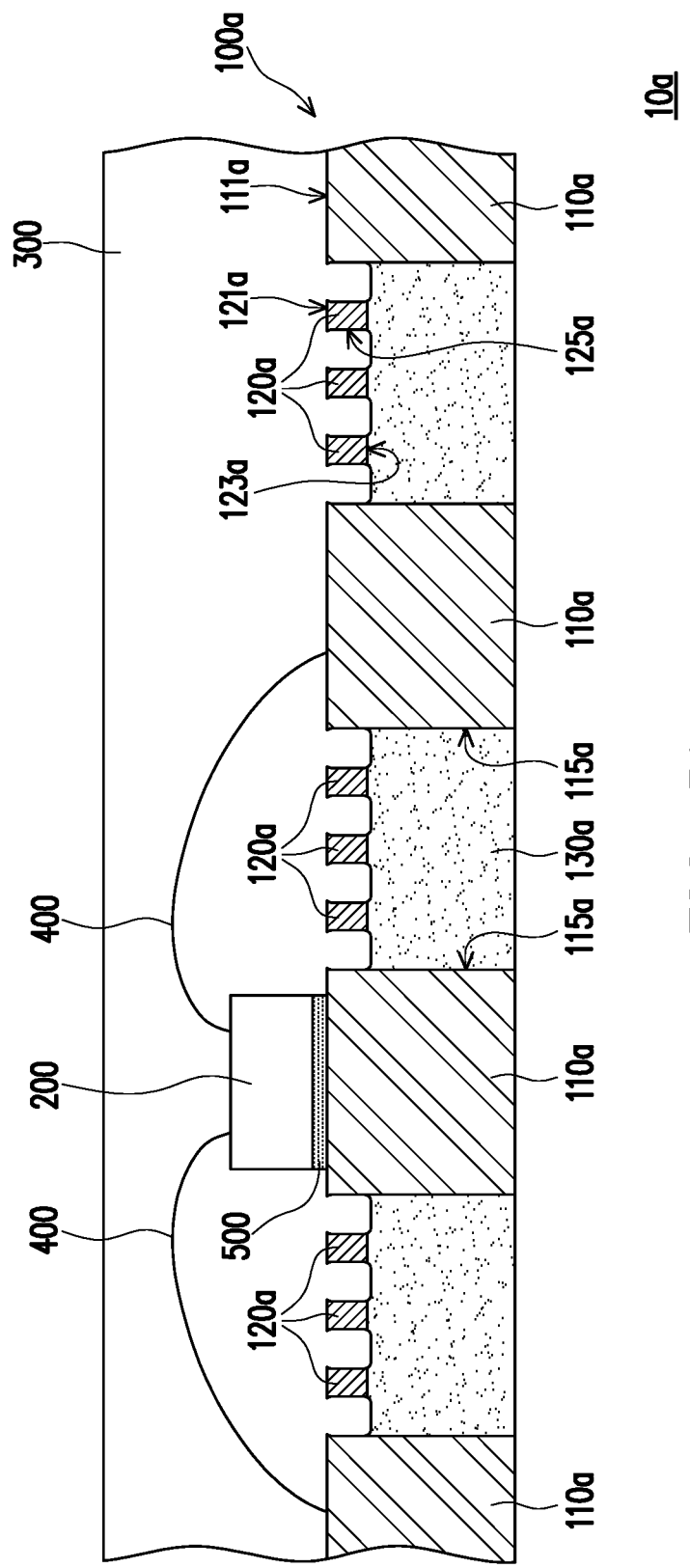
FIG. 3A is a schematic cross-sectional view of a package structure according to an embodiment of the invention.

FIG. 3A is a schematic cross-sectional view of a package structure according to an embodiment of the invention. Referring to FIG. 3A, a package structure 10a of the present embodiment includes the aforementioned package carrier 100a illustrated in FIG. 1B, at least one electronic component (which is schematically illustrated as one electronic component 200) and an encapsulant 300. The electronic component 200 is disposed on at least one of the first circuit patterns 110a. The electronic component 200 is, for example, a chip, a chip package or a passive device, but the invention is not limited thereto.

Furthermore, the package structure 10a of the present embodiment further includes at least one bonding wire (which is schematically illustrated as two bonding wires 400), wherein the electronic component 200 is electrically connected to the first circuit patterns 110a through the bonding wires 400. Moreover, the package structure 10a of the present embodiment further includes an adhesive layer 500 disposed between the electronic component 200 and the first circuit pattern 110a, wherein the electronic component 200 is fixed to the first circuit pattern 110a through the adhesive layer 500. In this case, the insulating layer 500 is, for example, a solder layer, but the invention is not limited thereto.

Moreover, the encapsulant 300 of the present embodiment covers the electronic component 200 and the package carrier 100a. As illustrated in FIG. 3A. the encapsulant 300 of the present embodiment covers the first surfaces 111a and a part of the side surfaces 115a of the first circuit patterns 110a, the second surfaces 121a and a part of the side surfaces 125a of the second circuit patterns 120a, the insulating material layer 130a, the electronic component 200, the bonding wires 400 and the adhesive layer 500 of the package carrier 100a. In this case, the material of the insulating material layer 130a may be the same as or different from the material of the encapsulant 300, which is not particularly limited in invention.

Since the package structure 10a of the present embodiment uses the package carrier 100a illustrated in FIG. 1B, the first circuit patterns 110a and the second circuit patterns 120a having different thicknesses may be simultaneously present on the same plane (i.e., the plane of the first surfaces 111a and the second surfaces 121a) to satisfy different circuit requirements for power supplying/grounding and signal transmission. In this way, the package structure 10a of the present embodiment may have preferable applicability and use flexibility.

Figure 3B:
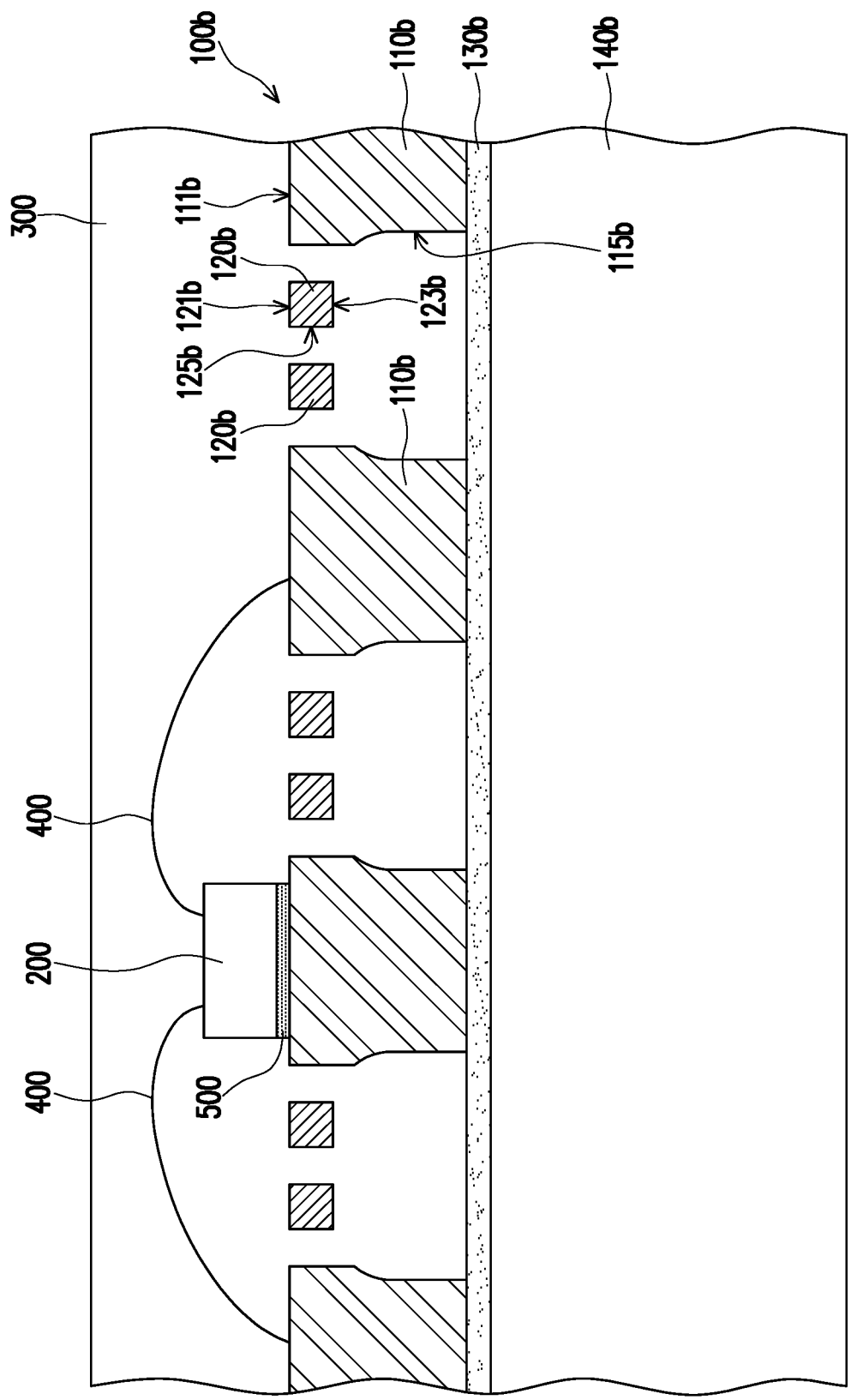
FIG. 3B is a schematic cross-sectional view of a package structure according to another embodiment of the invention.

FIG. 3B is a schematic cross-sectional view of a package structure according to another embodiment of the invention. Referring to FIG. 3B, a package structure 10b of the present embodiment includes the aforementioned package carrier 100b illustrated in FIG. 2, at least one electronic component (which is schematically illustrated as one electronic component 200) and an encapsulant 300. The electronic component 200 is disposed on at least one of the first circuit patterns 110b. The electronic component 200 is, for example, a chip, a chip package or a passive device, but the invention is not limited thereto.

Furthermore, the package structure 10b of the present embodiment further includes at least one bonding wire (which is schematically illustrated as two bonding wires 400), wherein the electronic component 200 is electrically connected to the first circuit patterns 110b through the bonding wires 400. Moreover, the package structure 10b of the present embodiment further includes an adhesive layer 500 disposed between the electronic component 200 and the first circuit pattern 110b, wherein the electronic component 200 is fixed to the first circuit pattern 110b through the adhesive layer 500. In this case, the insulating layer 500 is, for example, a solder layer, but the invention is not limited thereto.

Moreover, the encapsulant 300 of the present embodiment covers the electronic component 200 and the package carrier 100b. As illustrated in FIG. 3B. the encapsulant 300 of the present embodiment covers the first surfaces 111b and the side surfaces 115b of the first circuit patterns 110b, the second surfaces 121b and the side surfaces 125b of the second circuit patterns 120b, the insulating material layer 130b, the electronic component 200, the bonding wires and the adhesive layer 500 of the package carrier 100b, and is filled in gaps between the first circuit patterns 110b and gaps between the second circuit patterns 120b. In this case, the material of the insulating material layer 130b may be the same as or different from the material of the encapsulant 300, but the invention is not limited thereto.

Since the package structure 10b of the present embodiment uses the package carrier 100b illustrated in FIG. 2, the first circuit patterns 110b and the second circuit patterns 120b having different thicknesses may be simultaneously present on the same plane (i.e., the plane of the first surfaces 111b and the second surfaces 121b) to satisfy different circuit requirements for power supplying/grounding and signal transmission. In this way, the package structure 10b of the present embodiment may have preferable applicability and use flexibility.

Based on the above, in the design of the package carrier of the invention, the second circuit patterns are directly connected to the first circuit patterns, in a cross-sectional view, the first thickness of each of the first circuit patterns is greater than than the second thickness of each of the second circuit patterns. The first surface of each of the first circuit patterns is aligned with the second surface of each of the second circuit patterns. In this way, the package carrier of the invention can simultaneously include the circuit patterns having two different thicknesses on the same plane to satisfy different circuit requirements. Moreover, the package structure using the package carrier of the invention can have preferable applicability and use flexibility.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A package carrier, comprising:
   a plurality of first circuit patterns;
   a plurality of second circuit patterns, disposed between any two the first circuit patterns and directly connected to the first circuit patterns, wherein in a cross-sectional view, a first thickness of each of the first circuit patterns is greater than a second thickness of each of the second circuit patterns, and a first surface of each of the first circuit patterns is aligned with a second surface of each of the second circuit patterns; and
   an insulating material layer, at least contacting the first circuit patterns,
   wherein the first thickness ranges between 70 μm and 500 μm, and
   the insulating material layer directly contacts a bottom surface of each of the first circuit patterns without contacting the second circuit patterns.

2. The package carrier according to claim 1, further comprising:
   a substrate, the insulating material layer being located between the first circuit patterns and the substrate.

3. The package carrier according to claim 2, wherein the substrate comprises an insulating substrate or a conductive substrate.

4. The package carrier according to claim 2, wherein a material of the substrate comprises a metal, an alloy or a ceramic material.

5. The package carrier according to claim 1, wherein a thermal conductivity coefficient of the insulating material layer is greater than or equal to 10 W/m.K.

6. The package carrier according to claim 1, wherein in a cross-sectional view, a first linewidth of each of the first circuit patterns is greater than a second linewidth of each of the second circuit patterns.

7. A package structure, comprising:
a package carrier, comprising:
a plurality of first circuit patterns;
a plurality of second circuit patterns, disposed between any two the first circuit patterns and directly connected to the first circuit patterns, wherein in a cross-sectional view, a first thickness of each of the first circuit patterns is greater than a second thickness of each of the second circuit patterns, and a first surface of each of the first circuit patterns is aligned with a second surface of each of the second circuit patterns; and
an insulating material layer, at least contacting the first circuit patterns;
at least one electronic component, disposed on at least one of the first circuit patterns; and
an encapsulant, covering the least one electronic component and the package carrier,
wherein the first thickness ranges between 70 μm and 500 μm, and
the insulating material layer directly contacts a bottom surface of each of the first circuit patterns without contacting the second circuit patterns.

8. The package structure according to claim 7, wherein the package carrier further comprises:
a substrate, the insulating material layer being located between the first circuit patterns and the substrate.

9. The package structure according to claim 8, wherein the substrate comprises an insulating substrate or a conductive substrate.

10. The package structure according to claim 8, wherein a material of the substrate comprises a metal, an alloy or a ceramic material.

11. The package structure according to claim 7, wherein a thermal conductivity coefficient of the insulating material layer is greater than or equal to 10 W/m.K.

12. The package structure according to claim 7, wherein in a cross-sectional view, a first linewidth of each of the first circuit patterns is greater than a second linewidth of each of the second circuit patterns.

13. The package structure according to claim 7, further comprising:
an adhesive layer, disposed between the electronic component and at least one of the first circuit patterns.

14. The package structure according to claim 7, further comprising:
at least one bonding wire, the electronic component being electrically connected to at least one of the first circuit patterns through the at least one bonding wire.

* * * * *